United States Patent [19]

Kim

[11] Patent Number: 5,712,811
[45] Date of Patent: Jan. 27, 1998

[54] IC MEMORY CARD

[75] Inventor: Jo-Han Kim, Choongchungbook-Do, Rep. of Korea

[73] Assignee: LG Semicon Co., Ltd., Cheongju, Rep. of Korea

[21] Appl. No.: 583,391

[22] Filed: Jan. 5, 1996

[30] Foreign Application Priority Data

May 17, 1995 [KR] Rep. of Korea ............... 12254/1995

[51] Int. Cl.$^6$ ............................................. G11C 5/06
[52] U.S. Cl. ................................................ 365/63; 365/52
[58] Field of Search ............................ 365/52, 63, 72, 365/230.03, 51

[56] References Cited

U.S. PATENT DOCUMENTS

| | | | |
|---|---|---|---|
| 4,979,144 | 12/1990 | Mizuta | 364/900 |
| 5,119,338 | 6/1992 | Saito | 365/222 |
| 5,166,503 | 11/1992 | Mizuta | 364/900 |
| 5,237,674 | 8/1993 | Mohme | 365/52 |
| 5,375,084 | 12/1994 | Begun | 365/63 |
| 5,422,855 | 6/1995 | Eslick | 365/230.03 |
| 5,438,536 | 8/1995 | Salzman | 365/52 |
| 5,450,366 | 9/1995 | Watanabe | 365/230.03 |

Primary Examiner—David C. Nelms
Assistant Examiner—Son Mai
Attorney, Agent, or Firm—Fleshner & Kim

[57] ABSTRACT

An IC memory card capable of improving memory storage capacity and data processing speed by including a connector for interfacing with an external apparatus and providing 64-bits of data signals, 30-bits of address signals, and 8-bits of chip selection signals, which further includes a control unit for controlling read and write operations in accordance with control signals inputted via the connector; and a plurality of memory chips for inputting internal chip selection signals outputted from the control unit, being enabled by corresponding chip selection signals, and inputting/outputting data in accordance with the read and write signals outputted from the control unit.

11 Claims, 5 Drawing Sheets

| CONTROL SIGNAL AND DATA SIGNAL / FUNCTION | $CE0^*$ | $CE1^*$ | $A_0$ | $D_{15} \sim D_8$ | $D_7 \sim D_0$ |
|---|---|---|---|---|---|
| STAND BY STATE | H | H | X | HIGH-Z | HIGH-Z |
| 8 bit I/O | L | H | L | HIGH-Z | I/O |
|  | L | H | H | I/O | HIGH-Z |
|  | H | L | L | HIGH-Z | I/O |
|  | H | L | H | I/O | HIGH-Z |
| 16 bit I/O | L | L | X | I/O | I/O |

FIG. 6

| CONTROL SIGNAL AND DATA SIGNAL / FUNCTION | CE0* | CE1* | CE2* | CE3* | CE4* | CE5* | CE6* | CE7* | D63~D56 | D55~D48 | D47~D40 | D39~D32 | D31~D24 | D23~D16 | D15~D8 | D7~D0 |
|---|---|---|---|---|---|---|---|---|---|---|---|---|---|---|---|---|
| 8BIT I/O | L | H | H | H | H | H | H | H | High-z | High-z | High-z | High-z | High-z | High-z | High-z | I/O |
| | H | L | H | H | H | H | H | H | High-z | High-z | High-z | High-z | High-z | High-z | I/O | High-z |
| | H | H | L | H | H | H | H | H | High-z | High-z | High-z | High-z | High-z | I/O | High-z | High-z |
| | H | H | H | L | H | H | H | H | High-z | High-z | High-z | High-z | I/O | High-z | High-z | High-z |
| | H | H | H | H | L | H | H | H | High-z | High-z | High-z | I/O | High-z | High-z | High-z | High-z |
| | H | H | H | H | H | L | H | H | High-z | High-z | I/O | High-z | High-z | High-z | High-z | High-z |
| | H | H | H | H | H | H | L | H | High-z | I/O | High-z | High-z | High-z | High-z | High-z | High-z |
| | H | H | H | H | H | H | H | L | I/O | High-z | High-z | High-z | High-z | High-z | High-z | High-z |
| 16BIT I/O | L | L | H | H | H | H | H | H | High-z | High-z | High-z | High-z | High-z | High-z | I/O | I/O |
| | . | . | . | . | . | . | . | . | . | . | . | . | . | . | . | . |
| | H | H | H | H | H | H | L | L | I/O | I/O | High-z | High-z | High-z | High-z | High-z | High-z |
| 32BIT I/O | L | L | L | L | H | H | H | H | High-z | High-z | High-z | High-z | I/O | I/O | I/O | I/O |
| | . | . | . | . | . | . | . | . | . | . | . | . | . | . | . | . |
| | H | H | H | H | L | L | L | L | I/O | I/O | I/O | I/O | High-z | High-z | High-z | High-z |
| 64BIT I/O | L | L | L | L | L | L | L | L | I/O | I/O | I/O | I/O | I/O | I/O | I/O | I/O |

IC MEMORY CARD

BACKGROUND OF THE INVENTION

1. Field of the Invention

The present invention relates to an IC memory card, and particularly to an IC memory card which is capable of improving memory storage capacity and data processing speed by increasing the number of pins used as interface connectors and by using the increased number of pins for data signals, address signals, and control signals.

2. Description of the Conventional Art

Referring to FIG. 1, there is schematically shown a conventional IC memory card, whereby the IC memory card includes a connector 10 for interfacing with an external device; a control unit 20 for controlling input/output of data signals D0 to D15 in accordance with address signals A0 to A25, a read signal/OE, a write signal/WE, and first and second chip selection signals/CE0 and/GE1 inputted via the connector 10; a fast memory chip 30 for inputting/outputting the data signals D0 to D7 in accordance with an internal read signal OE*, an internal write signal WE*, and a first internal chip selection signal CE0* outputted from the control unit 20; a second memory chip 31 for inputting/outputting the data signals D0 to D7 in accordance with the internal read signal OE*, the internal write signal WE*, and a second internal chip selection signal CE1*; a third memory chip 32 for inputting/outputting the data signals D8 to D15 in accordance with the internal read signal OE*, the internal write signal WE*, and the first internal chip selection signal CE0*; and a fourth memory chip 33 for inputting/outputting the data signals D8 to D15 in accordance with the internal read signal OE*, the internal write signal WE*, and the second internal chip selection signal CE1*.

The connector 10, as shown in FIGS. 2A to 2C, includes sixty-eight pins, P1 to P68, provided at the bottom of the IC memory card.

Here, the first pin P1 to the thirty-fourth pin P34 are provided in a row at predetermined intervals, as shown in FIG. 2A, and the thirty-fifth pin P35 to the sixty-eighth pin P68 are provided in parallel row at positions corresponding with the first pin P1 to the thirty-fourth pin P34, respectively. Accordingly, the first pin P1 and the thirty-fifth pin P35 are facing each other, as shown in FIG. 2B. Here, the pitch interval of these pins P1 to P68 is 1.27±0.1 min.

Further, the pins P1 to P68 respectively carry the address signals A0 to A25, the data signals D0 to D15, the read signal/OE, the write signal/WE and other control signals such as a supply voltage signal.

The operation of the conventional IC memory card having above-described structure will be explained, with reference to the drawings.

First, the connector 10 is connected to an external apparatus such as a microcomputer which accesses the IC memory card. The accessing operation is performed when the data stored in the IC memory card is read or new data is written into the IC memory card.

When the external apparatus accesses the IC memory card, control signals such as the read signal/OE, the write signal/WE, the first and second chip enable signals /CE0 and/CE1, and the address signals A0 to A25 are inputted to the control unit 20 via the connector 10. Here, the address signal A0 is used as a control signal. When new data is written into the IC memory card, the data signals D0 to D15 are inputted to the control unit 20 together with the above-mentioned control signals.

The control unit 20 generates the internal read signal OE* for reading the data stored in the memory chips 30 to 33, the internal write signal WE* for writing the data into the memory chips 30 to 33, the first internal chip selection signal CE0* for selecting the first and third memory chips 30 and 32, and the second internal chip selection signal CE1* for selecting the second and fourth memory chips 31 and 33.

Consequently, the address signals A0 to A25, the internal read signal OE* and the internal write signal WE* are commonly inputted to the first to fourth memory chips 30 to 33. The first internal chip selection signal CE0* is respectively inputted to the first and third memory chips 30 and 32, and the second internal chip selection signal CE1* is respectively inputted to the second and fourth memory chips 31 and 33.

Data signals inputted/outputted to/from data bus DB are different according to the level of the control signals inputted to each memory chip 30 to 33.

Referring to FIG. 3, when data is read, the internal read signal OE* becomes low level and the internal write signal WE* becomes high level. In the case that the levels of the first and second internal chip selection signals are respectively high, the data bus corresponding to the high data signals D8 to D15, and the low data signals D0 to D7 assumes a high impedance state, respectively, regardless of the level of the address signal A0. Accordingly, the data signals D0 to D15 are not outputted from the memory chips 30 to 33, and the IC memory card is in a standby state.

Here, "L" means low level, "H" means high level, and "X" means irrelevant. "HIGH-Z" indicates that the corresponding data bus is in a high impedance state. Further, "T" indicates "write", and "O" means "read".

When the first internal chip selection signal CE0* and the address signal A0 are both low level and the second internal chip selection signal CE1* is high level, the data bus corresponding to the high data signals D8 to D15 assumes a high impedance state, and the low data signals D0 to D7 are outputted to the control unit 20 via the data bus DB. Here, when the address signal A0 is high level, the data bus corresponding to the low data signals D0 to D7 assumes a high impedance state, and thereby the high data signals D8 to D15 outputted from the third memory chip 32 are outputted to the control unit 20 via the data bus DB. Afterwards, the low data signals D0 to D7 and the high data signals D8 to D15 inputted to the control unit 20 are outputted to the external apparatus via the connector 10, and thereby 8-bit data is read by the external apparatus.

In the case that the first internal chip selection signal CE0* is high level, and the second internal chip selection signal CE1* and the address A0 are both low level, the data bus corresponding to the high data signals D8 to D15 assumes a high impedance state, and thereby the low data signals D0 to D7 outputted from the second memory chip 30 are outputted to the control unit 20 via the data bus DB. Here, when the address signal A0 is high level, the data bus corresponding to low data signals D0 to D7 assumes a high impedance state, and thereby the high data signals D8 to D15 outputted from the fourth memory chip 32 are outputted to the control unit 20 via the data bus DB. Accordingly, similarly as described above, 8-bit data is read by the external apparatus.

When the first and second chip selection signals CE0* and CE1* are respectively low level, regardless of the address signal A0, the low data signals D0 to D7 from the first memory chip 30 or the second memory chip 31, and the high data signals D8 to D15 from the third memory chip 32 or the fourth memory chip 33 are respectively outputted to the control unit 20 via the data bus DB. Accordingly, 16-bit data is read by the external apparatus.

On the other hand, when new data is written into the IC memory card, the internal read signal OE* becomes high level and the internal write signal WE* becomes low level. Accordingly, as shown in FIG. 3, new data are respectively stored in the first to fourth memory chips 30 to 33 in accordance with the level of the control signals.

However, the conventional IC memory card uses 26-bit address signals and has a maximum storage capacity of 64 mega bytes. Also, since one terminal chip selection signal is commonly connected to a plurality of memory chips, a maximum of 16 bits of data can be parallelly inputted/ outputted. Accordingly, data processing speed is decreased when the external apparatus is directed to process 32-bit or 64-bit data in parallel.

SUMMARY OF THE INVENTION

Therefore, it is an object of the present invention to provide an IC memory card which is capable of improving memory storage capacity and data processing speed by increasing the number of pins used as interface connectors and by using the increased number of pins for data signals, address signals, and control signals.

To achieve the above-described object, the IC memory card according to the present invention includes a connector for interfacing with an external apparatus; a control unit for controlling read and write operations in accordance with control signals inputted via the connector; and a plurality of memory chips being respectively selected when appropriate internal chip selection signals are inputted among a plurality of internal chip selection signals outputted from the control unit, and for inputting/outputting data in accordance with the read and write signals outputted from the control unit.

BRIEF DESCRIPTION OF THE DRAWINGS

The above object and advantages of the present invention will be more clearly understood from the following detailed description taken in conjunction with the accompanying drawings, in which:

FIGS. 2A to 2C are views to explain a connector in FIG. 1, in which;

FIG. 2A is a from view of the conventional IC memory card;

FIG. 2B is a right side view of the conventional IC memory card; and

FIG. 2C is a bottom view of the conventional IC memory card;

FIGS. 5A to 5C are views to explain a connector in FIG. 4, in which;

FIG. 5A is a from view of the IC memory card according to the present invention;

FIG. 5B is a right side view of the IC memory card according to the present invention; and FIG. 5C is a bottom view of the IC memory card according to the present invention; and FIG. 6 is a table illustrating the number of bits of data signals inputted/outputted in accordance with control signals inputted to each memory chip, in FIG. 4.

DETAILED DESCRIPTION OF THE PREFERRED EMBODIMENTS

Figure 1:
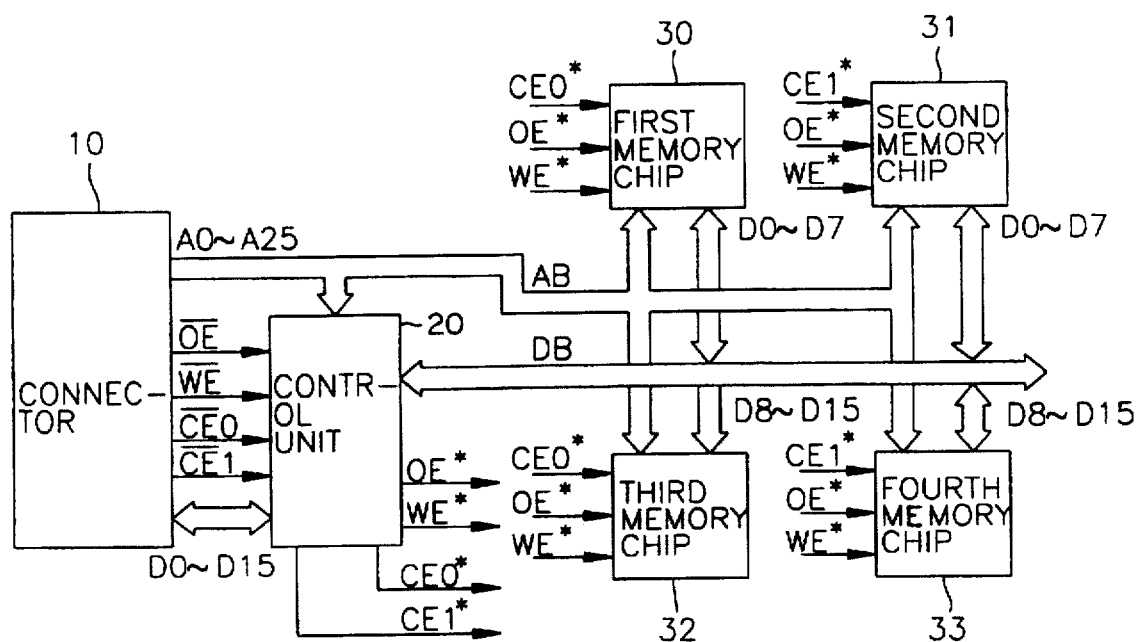
FIG. 1 is a schematic block diagram of a conventional IC memory card.
Figure 2A:
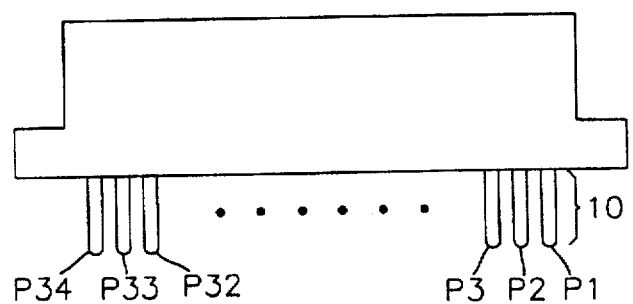
Figure 2B:
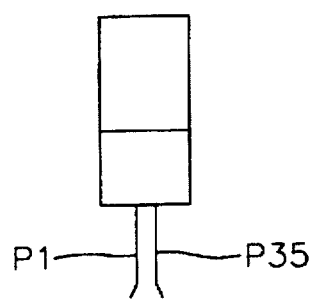
Figure 2C:
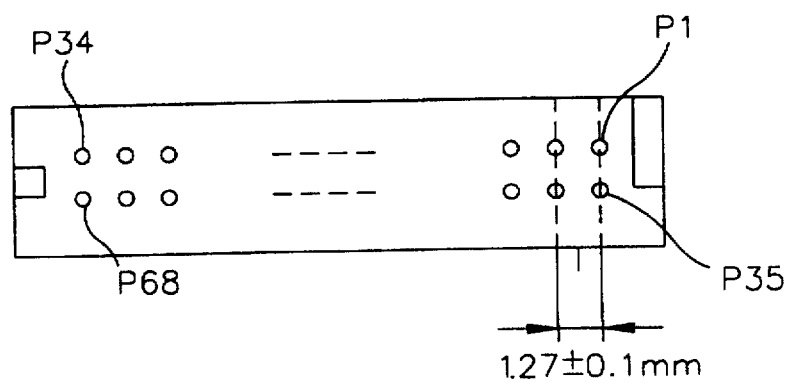
Figures 3, 4:
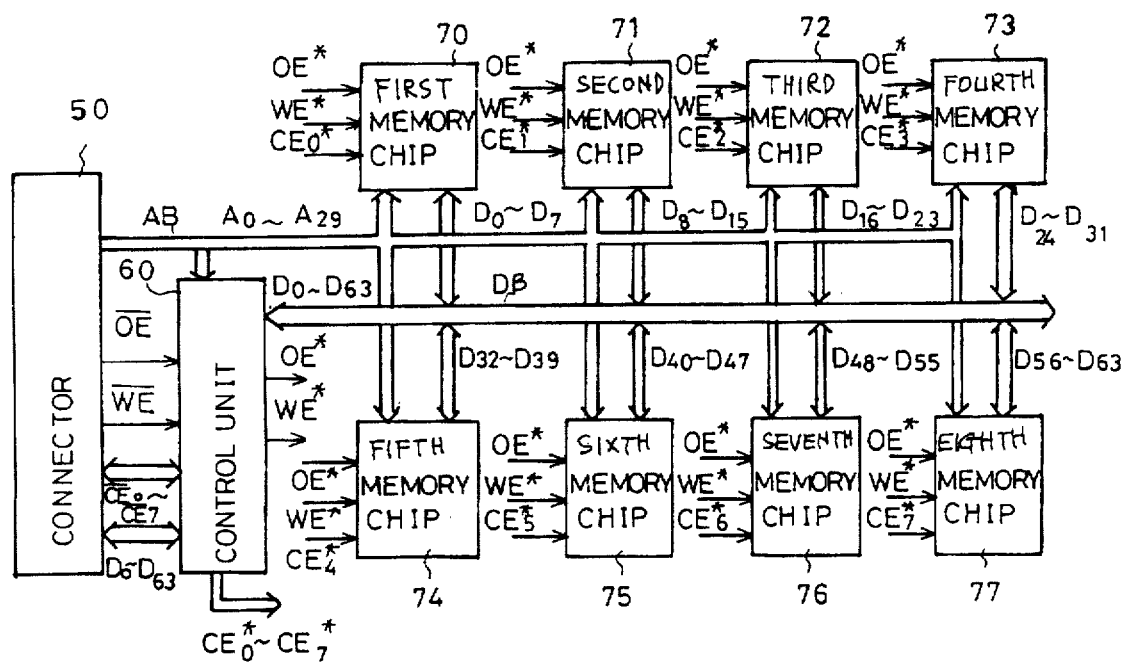
FIG. 3 is a table illustrating the number of bits of data signals inputted/outputted in accordance with control signals inputted to each memory chip, in FIG. 1.
FIG. 4 is a schematic block diagram of an IC memory card according to the present invention.

Referring to FIG. 4, an IC memory card according to the present invention includes a connector 50 for interfacing with an external apparatus; a control unit 60 for controlling the input/output of data signals D0 to D63 in accordance with address signals A0 to A29 inputted via an address bus AB connected to the connector 50, a mad signal/OE, a write signal/WE, and first to eighth chip selection signals /CE0 to /CE7; a first memory chip 70 for inputting/outputting data signals D0 to D7 in accordance with an internal read signal OE*, an internal write signal WE*, and a first internal chip selection signal outputted from the control unit 60; a second memory chip 71 for inputting/outputting data signals D8 to D15 in accordance with the internal mad signal OE*, the internal write signal WE*, and a second internal chip selection signal CE1*; a third memory chip 72 for inputting/ outputting data signals D16 to D23 in accordance with the internal read signal OE*, the internal write signal WE*, and a third internal chip selection signal CE2*; a fourth memory chip 73 for inputting/outputting data signals D24 to D31 in accordance with the internal read signal OE*, the internal write signal WE*, and a fourth internal chip selection signal CE3*; a fifth memory chip 74 for inputting/outputting data signals D32 to D39 in accordance with the internal read signal OE*, the internal write signal WE* and a fifth internal chip selection signal CE4*; a sixth memory chip 75 for inputting/outputting data signals D40 to D47 in accordance with the internal read signal OE*, the internal write signal WE* and a sixth internal chip selection signal CE5*; a seventh memory chip 76 for inputting/outputting data signals D48 to D55 in accordance with the internal read signal OE*, the internal write signal WE* and a seventh internal chip selection signal CE6*; and an eighth memory chip 77 for inputting/outputting data signals D56 to D63 in accordance with the internal mad signal OE*, the internal write signal WE* and an eighth internal chip selection signal CE7*.

Figure 5A:
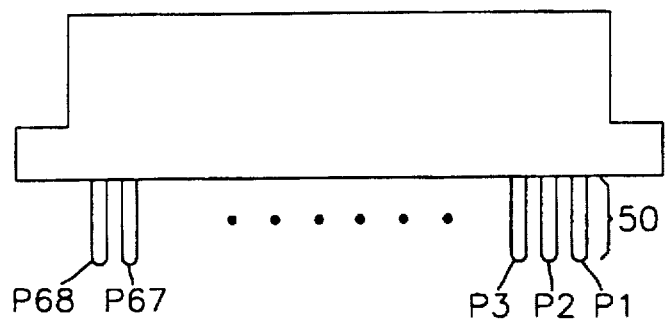
Figure 5B:
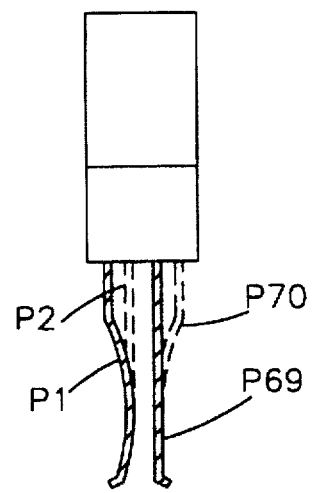
Figure 5C:
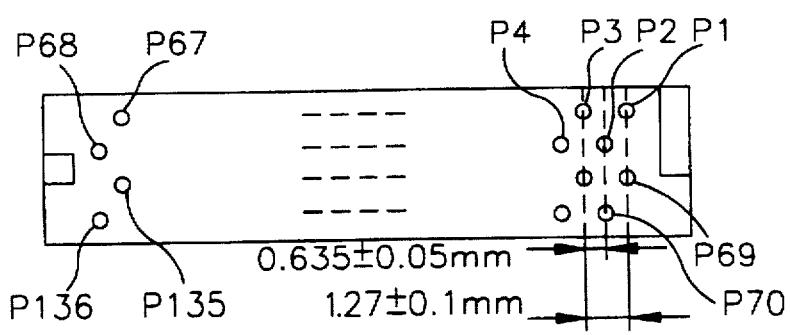

The connector 50, as shown in FIGS. 5A to 5C, includes one hundred and thirty-six pins, P1 to P136, provided at the bottom of the IC memory card. Here, the pins P1 through P68 are placed at predetermined intervals, as shown in FIG. 5A. The pins P69 through P136 are aligned with the pins P1 through P68, one to one. Accordingly, as shown in FIG. 5B, the first pin P1 and the sixty-ninth pin P69, and the second pin P2 and the seventieth pin P70 are aligned with each other, wherein the first pin P1 and the second pin P2 have bent forms to make the intervals between the lower end of the pins which are parallelly arranged narrower than at their upper ends.

On the other hand, the pins P1 to P136 are, as shown in FIG. 5C, divided into four rows: pins of the first row P1, P3, P5, . . . , P65, P67; pins of the second row P2, P4, P6, . . . , P66, P68; pins of the third row P69, P71, P73, . . . , P133, P135; and pins of the fourth row P70, P72, P74, . . . , P134, P136. Of the four rows of pins, pins of rows adjacent to each other are arranged crosswise so as not to align with their pitches, and the pitch interval between the pins is 0.635±0.05 mm. Thereafter, as the pitch interval of the pins P1 to P136 is narrower than the conventional pitch interval 1.27±0.1 mm, the connecter 50 having the same size as the conventional connector can have a greater number of pins.

Additionally, the pins P1 to P136 respectively correspond to the control signals such as the address signals A0 to A29, the data signals D0 to D63, the read signal/OE, the write signal/WE, and the chip selection signals/CE0 to /CE7.

The operation of the IC memory card according to the present invention having the above-described structure will be explained, referring to the drawings.

When an external apparatus accesses the IC memory card, the control signals such as the read signal/OE, the write signal/WE and the chip selection signals/CE0 to /CE7, and the address signals A0 to A29 are inputted to the control unit 60 via the connector 50. When new data are written into the IC memory card, the data signals D0 to D63 are inputted to the control unit 60, together with the control signals.

Afterwards, the control unit 60 properly converts the read signal/OE, the write signal/WE and the chip selection signals/CE0 to CE7 for internal circuit operation, and outputs to the corresponding memory chips the internal read signal OE* for outputting the data stored in memory chips 70 to 77, the internal write signal WE* for storing the data in the memory chips 70 to 77, and the internal chip selection signals CE0 * to CE7* for selecting one memory chip among the memory chips 70 to 77. Further, the data signals D0 to D63 are buffered by the control unit 60, and inputted to each memory chip 70 to 77 via the data bus DB. Otherwise, they are outputted to the external apparatus via the connector 50.

The address signals A0 to A25, the internal read signal OE* and the internal write signal WE* are commonly inputted to the first memory chip 70 to the eighth memory chip 77. The first internal chip selection signal CE0* is inputted to the first memory chip 70, the second internal chip selection signal CE1* to the second memory chip 71, the third internal chip selection signal CE2* to the third memory chip 72, and the fourth internal chip selection signal CE3* to the fourth memory chip 73, respectively. Similarly, the fifth internal chip selection signal CE4* is inputted to the fifth memory chip 74, the sixth internal chip selection signal CE5* to the sixth memory chip 75, the seventh internal chip selection signal CE6* to the seventh memory chip 76, and the eighth internal chip selection signal CE7* to the eighth memory chip 77, respectively.

Thereafter, 8-bit data signals D0 to D7, D8 to D15, D16 to D23, D24 to D31, D32 to D39, D40 to D47, D48 to D55, and D56 to D63 are respectively inputted/outputted via the data bus DB from the memory chips whose internal chip selection signal of low level is inputted, among the memory chips 70 to 77.

Accordingly, when the number of the internal chip selection signals of a low level is 1, 2, 4 and 8, data of 8-bits, 16-bits, 32-bits and 64-bits is respectively inputted/outputted. And, the data bus connected to the memory chip to which the internal chip selection signal of high level is inputted assumes a high impedance state.

As a result, in the IC memory card in accordance with the present invention, a maximum of 64-bits of data can be read or written parallelly. Further, when address signal A0 is used as a control signal, the storage capacity of the IC memory card can be increased, because the address signal A0 is used in combination with the internal chip selection signals CE0* to CE7*.

As described above, in the memory card of the present invention, as the number of the pins included in the connector is increased, the number of address signal bits and the number of data signal bits capable of being parallelly processed are increased therewith, and since each internal chip selection signal is connected to one of the memory chips, the storage capacity can be increased and the data processing speed can be enhanced. Further, since the size of the connector in accordance with the present invention is similar to that of a conventional connector, it can be adapted to portable apparatus requiring a large storage capacity and rapid data processing speed.

What is claimed is:

1. An IC memory card, comprising:
   a connector means for interfacing with an external apparatus which generates a plurality of signals including a plurality of external chip selection signals;
   a control means for controlling read and write operations in accordance with control signals inputted via the connector means; and
   a plurality of memory chips being respectively selected when appropriate internal chip selection signals are inputted among a plurality of internal chip selection signals outputted from said control means, and inputting/outputting data in accordance with the read and write signals outputted from the control means, wherein there is a one-to-one correspondence between a number of memory chips and a number of external chip selection signals, and said connector means includes one hundred and thirty-six pins for interfacing including thirty pins for address signals, sixty-four pins for data signals, and eight pins for internal chip selections signals.

2. The IC memory card of claim 1, wherein said pins for interfacing are divided into four rows, and of the four rows of pins, pins of rows adjacent to each other are arranged crosswise so as not to align with their pitches, and wherein the pitch interval between the pins is predetermined.

3. The IC memory card of claim 1, wherein said internal chip selection signals correspond in number to said memory chips, and each memory chip is respectively selected by the corresponding internal chip selection signal.

4. A memory card comprising:
   a prescribed number of memory chips;
   a control unit, coupled to the prescribed number of memory chips, for controlling operations for reading data from the memory chips and writing data into the memory chips;
   a connector, coupled to the memory chips and said control unit, for interfacing with an external device such that data is transferred between the memory card and the external device including external chip selection signals designating selection of corresponding memory cell chips for one of reading and writing, wherein said connector includes a plurality of pins arranged in rows and columns, adjacent rows of pins being offset from each other, and there is a one-to-one correspondence between the prescribed number of memory chips and a number of external chip selection signals.

5. The memory card of claim 4, wherein said control unit is responsive to the external chip selection signals to generate internal chip selection signals.

6. The memory card of claim 4, wherein said connector includes a plurality of pins for interfacing with the external device including a plurality of pins for address signals and data signals and the number of external chip selection signals.

7. The memory card of claim 4, wherein alternating rows are aligned with each other.

8. The memory card of claim 4, wherein odd rows are aligned with each other and even rows are aligned with each other.

9. The memory card of claim 8, wherein each pin of an even row of pins has a bent portion.

10. The memory card of claim 4, wherein each pin in alternating columns has a bent portion.

11. The memory card of claim 10, wherein the alternating columns are even columns.

* * * * *